US008306169B2

(12) United States Patent  (10) Patent No.: US 8,306,169 B2
Kim et al.  (45) Date of Patent: Nov. 6, 2012

(54) SEMICONDUCTOR DEVICES, METHODS OF OPERATING SEMICONDUCTOR DEVICES, AND SYSTEMS HAVING THE SAME

(75) Inventors: Jin Gook Kim, Suwon-si (KR); Dae Hyun Chung, Daejeon (KR); Seung Jun Bae, Daejeon (KR); Seung Hoon Lee, Suwon-si (KR); Won Hwa Shin, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 850 days.

(21) Appl. No.: 12/318,773

(22) Filed: Jan. 8, 2009

(65) Prior Publication Data
US 2009/0174445 A1 Jul. 9, 2009

(30) Foreign Application Priority Data
Jan. 8, 2008 (KR) .................. 10-2008-0001985

(51) Int. Cl.
*H04L 12/66* (2006.01)
(52) U.S. Cl. ...................................... 375/354
(58) Field of Classification Search .................. 375/354, 375/373, 376, 294; 327/147, 153, 158, 159, 327/161; 365/193, 233.1
See application file for complete search history.

(56) References Cited

U.S. PATENT DOCUMENTS

| 7,282,973 | B1* | 10/2007 | Charagulla et al. ........... 327/158 |
| 2006/0262613 | A1 | 11/2006 | Braun et al. |
| 2007/0240012 | A1* | 10/2007 | Burney et al. ................. 713/500 |

FOREIGN PATENT DOCUMENTS

| JP | 2005-044494 | 2/2005 |
| KR | 10-0626375 | 9/2006 |
| KR | 10-2006-0111412 | 10/2006 |
| KR | 10-2007-0054017 | 5/2007 |

OTHER PUBLICATIONS

English language Abstract of KR 10-2005-0010704 dated Jan. 28, 2005.

* cited by examiner

*Primary Examiner* — Khai Tran
(74) *Attorney, Agent, or Firm* — Harness, Dickey & Pierce

(57) ABSTRACT

A semiconductor device includes a selection circuit and a phase detector. The selection circuit, in response to a first selection signal output from a controller, outputs as a timing signal a first clock signal output from the controller or an output signal of a PLL using the first clock signal as a first input. The phase detector generates a voltage signal indicating a phase difference between a second clock signal output from the controller and the timing signal output from the selection circuit. The semiconductor device further includes a data port, a memory core storing data, and a serializer, in response to the timing signal output from the selection circuit, serializing the data output from the memory core and outputting serialized data to the controller via the data port. The first selection signal is generated by the controller based on at least one of the voltage signal and the data output to the controller via the data port.

25 Claims, 3 Drawing Sheets

SEMICONDUCTOR DEVICES, METHODS OF OPERATING SEMICONDUCTOR DEVICES, AND SYSTEMS HAVING THE SAME

PRIORITY STATEMENT

This application claims priority under 35 U.S.C. §119 to Korean Patent Application No. 10-2008-0001985, filed on Jan. 8, 2008, in the Korean Intellectual Property Office, the entire contents of which is incorporated herein by reference.

BACKGROUND

Description of the Related Art

FIG. 1 is a block diagram for explaining a conventional data output time (tSAC) compensation scheme in a conventional Double Data Rate Synchronous Dynamic Random Access Memory (DDR SDRAM). Referring to FIG. 1, for a controller to accurately know the output timing of data DQ, the timing of a clock signal CLK and the output timing of the data DQ are aligned (tuned) with one another at pads (not shown) of a conventional semiconductor device 1.

To align the output edge of the data DQ to the input edge of the clock signal CLK, in the conventional semiconductor device 1, a phase locked loop/delay locked loop (PLL/DLL) 7 compensates for a delay until the data DQ is output. A serializer 5 serializes the data output from a memory core 3 in response to the output signal of the PLL/DLL 7 and outputs serialized data DQ.

Assuming that the delay time during which the clock signal CLK is transmitted to an input end of the serializer 5 via the PLL/DLL 7 is "tI" and the delay time during which the data DQ is transmitted from the serializer 5 to the pad (e.g., the data pad from which the data DQ is subsequently output) is tO (referred to as the "tSAC"), when a replica path 9 having a delay "(tI+tO)" is input as a feedback path of the PLL/DLL 7, the output edge of the data DQ and the input edge of the clock signal CLK may be matched or aligned with one another. In the above-described example, data is input/output using only a single clock signal (CLK).

Conventional next generation memories, however, (e.g., GDDR5 or the like) are operated with multiple different clocks. Conventionally, these clocks include a differential command clock (CK) and a forwarded differential write clock (WCK). The differential clock (CK) is related to the input/output of an address/command, whereas the forwarded differential write clock (WCK) is related to writing data/reading data. In memories such as this, the clocks CK and WCK are synchronized or aligned with one another during initialization and training sequences. But, to improve the performance of a system using, for example, two different clocks, further synchronization and alignment of the two different clocks may be necessary.

SUMMARY

Example embodiments relate to semiconductor devices, for example, semiconductor devices, which may align a plurality of clock signals input to the semiconductor device according to at least one characteristic of a phase locked loop implemented in a semiconductor device and/or at least one characteristic of a semiconductor system including the semiconductor device. Example embodiments also relate to aligning methods, and semiconductor systems.

At least one example embodiment provides a semiconductor device, which may select a clocking structure according to synchronization of at least two clock signals, a jitter characteristic of an input clock signal, a jitter characteristic of a PLL, and/or a characteristic of a replica path, an aligning method, and a semiconductor system including the semiconductor device.

According to at least one example embodiment, a semiconductor device may include a selection circuit and a phase detector. The selection circuit may output a first clock signal output from the controller or an output signal of a PLL as a timing signal using the first clock signal as a first input. The first clock signal may be output in response to a first selection signal output from a controller. The phase detector may generate a voltage signal indicating a phase difference between a second clock signal output from the controller and the timing signal output from the selection circuit.

According to at least one other example embodiment, the semiconductor device may further include a data port, a memory core storing data and a serializer. The serializer may serialize the data output from the memory core and output serialized data to the controller via the data port in response to the timing signal output from the selection circuit. The first selection signal may be generated by the controller based on at least one of the voltage signal and the data output to the controller via the data port. The controller may align a phase of at least one of the first clock signal and the second clock signal based on the voltage signal generated by the phase detector.

According to at least some example embodiments, the first clock signal may be related to the input/output of the data and the second clock signal may be related to the input/output of addresses/commands. The selection circuit may include a first selector. The first selector may output the first clock signal or the output signal of the PLL as the timing signal in response to the first selection signal. The delay circuit may delay the output signal from the first selector. A second selector may output the timing signal or an output signal of the delay circuit as a second input of the PLL in response to a second selection signal output from the controller.

According to at least one other example embodiment, a semiconductor system may include a controller and a semiconductor device. The controller may output a first selection signal, a first clock signal and a second clock signal. The semiconductor device may communicate with the controller, and may include a selection circuit. The selection circuit may output the first clock signal or an output signal from a PLL as a timing signal in response to the first selection signal. A phase detector may generate a voltage signal indicative of a phase difference between the second clock signal and the timing signal.

According to at least some example embodiments, the controller may include a phase aligner. The phase aligner may align a phase of at least one of the first clock signal and the second clock signal in response to a received voltage signal.

At least one other example embodiment provides a method of aligning a first clock signal to a second clock signal. According to this example embodiment, a first clock signal provided by the controller or an output signal generated using a PLL may be output as a timing signal in response to a first selection signal provided by a controller. Data output from a memory core may be output to the controller via a data port in response to the timing signal. The first clock signal may be generated by the controller based on the data.

According to at least some example embodiments, a voltage signal corresponding to a phase difference between a second clock signal output from the controller and the timing signal may be generated, and the generated voltage signal may be output to the controller. A phase of at least one of the first clock signal and the second clock signal may be aligned according to the output voltage signal.

BRIEF DESCRIPTION OF THE DRAWINGS

Example embodiments will become more apparent by describing in detail the example embodiments shown in the attached drawings in which.

DETAILED DESCRIPTION OF EXAMPLE EMBODIMENTS

Figure 1:
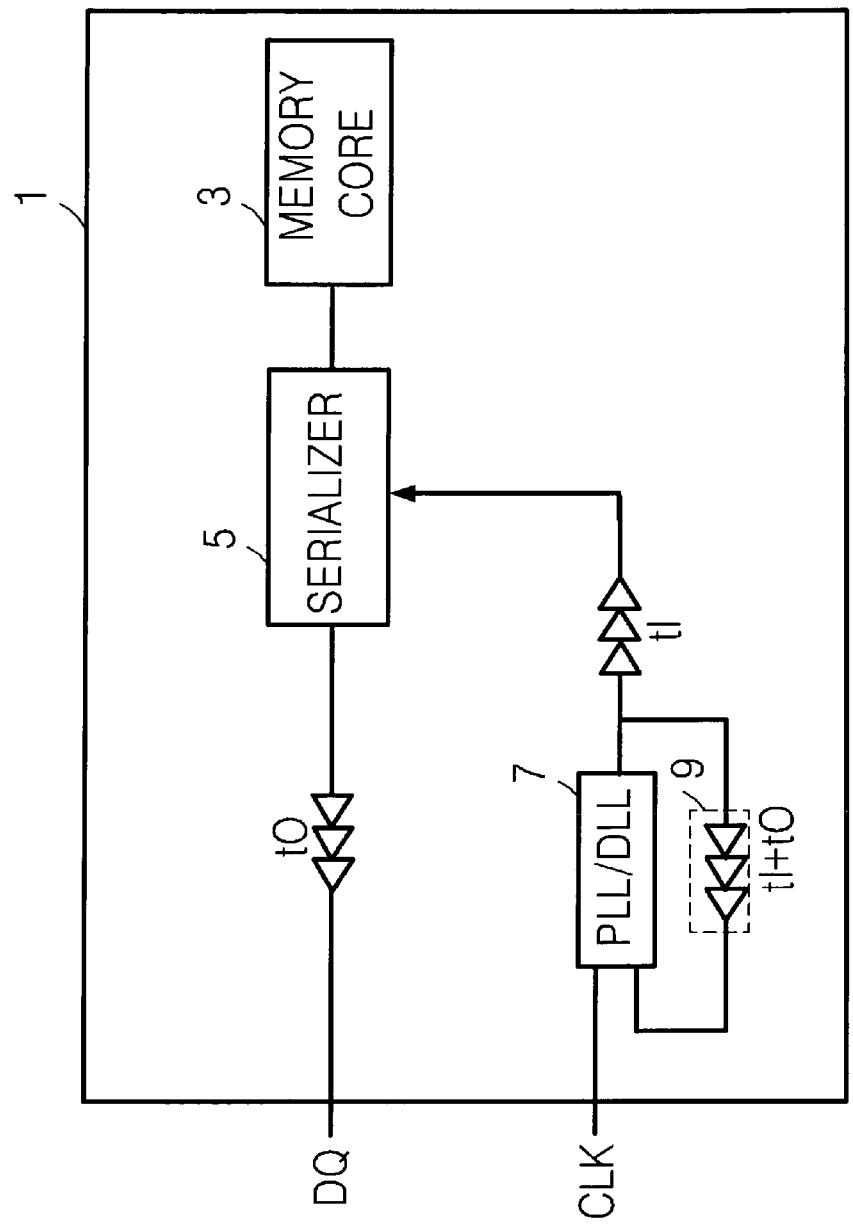
FIG. 1 is a block diagram to explain a tSAC compensation scheme in a conventional DDR SDRAM.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 2:
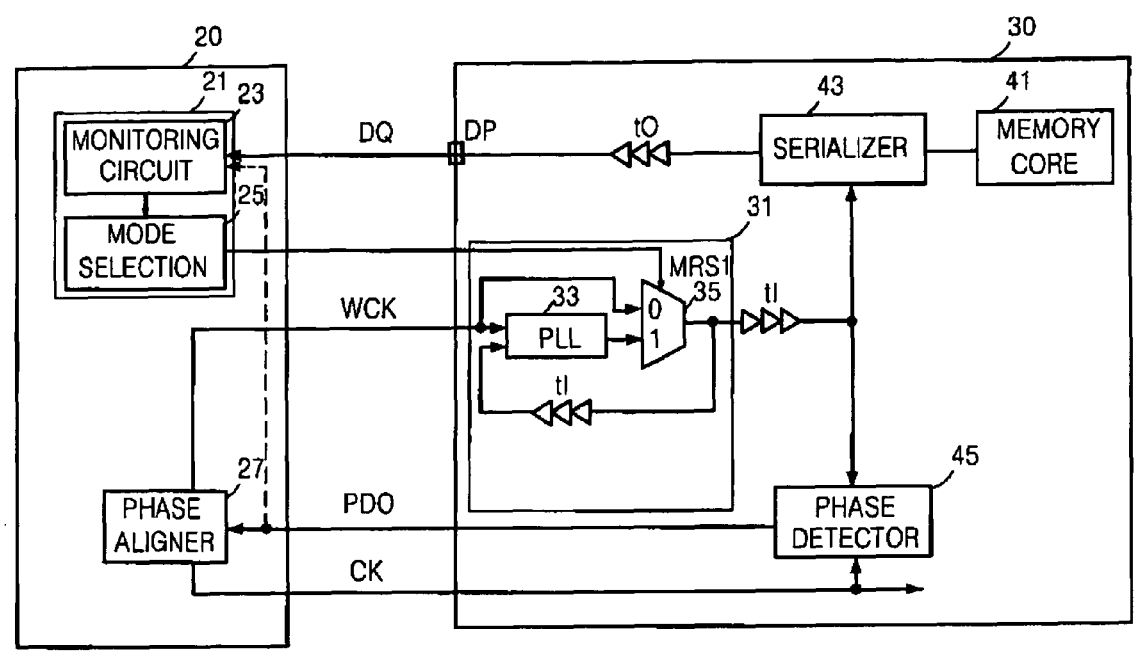
FIG. 2 is a block diagram of a semiconductor system according to an example embodiment.

FIG. 2 is a block diagram of a semiconductor system according to an example embodiment. Referring to FIG. 2, a system for synchronizing or aligning a first clock signal WCK and a second clock signal CK may include a semiconductor system 10 which may further include a controller 20 and a semiconductor device 30. A data bus for exchanging data and an address/command bus for exchanging addresses and commands may be connected between the controller 20 and the semiconductor device 30.

The controller 20 may include a selection signal generation circuit 21 and a phase aligner 27. The selection signal generation circuit 21 may output a first selection signal MRS1 in response to at least one of data DQ received through a data port DP and a voltage signal PDO output from a phase detector 45.

The selection signal generation circuit 21 may include a monitoring circuit 23 and a mode selection signal generation circuit 25. The monitoring circuit 23 may analyze at least one characteristic of the semiconductor device 30 or at least one characteristic of the data bus or channel through data training or jitter of the data DQ input through the data bus, and output an analysis signal to the mode selection signal generation circuit 25 according to a result of the analysis.

The monitoring circuit 23 may analyze the at least one characteristic of the semiconductor device 30 in response to the voltage signal PDO output from the phase detector 45, and output an analysis signal according to a result of the analysis to the mode selection signal generation circuit 25. The mode selection signal generation circuit 25 may output the first selection signal MRS1 in response to at least one analysis signal from the monitoring circuit 23. The first selection signal MRS1 may be set by a mode register set (MRS) or the like.

The phase aligner 27 may align the phase of at least one of the first clock signal WCK and the second clock signal CK in response to the voltage signal PDO from the phase detector 45, and output first clock signal WCK and second clock signal CK having aligned or substantially aligned phases.

The first clock signal WCK may be a clock signal related to the input/output of data. The second clock signal CK may be a clock signal related to the input/output of addresses/commands. For example, in a GDDR5, the first clock signal WCK may be a forwarded differential write clock and the second clock signal CK may be a differential command clock.

The semiconductor device 30 may include a data port DP, a selection circuit 31, a memory core 41, a serializer 43, and phase aligner 45. In the example embodiment shown in FIG. 2, "tI" and "tO" indicate delay time due to a signal path (e.g., a bus, an electric wire, a constituent element or the like). The semiconductor device 30 may exchange data with the controller 20 through the data port DP.

The selection circuit 31 may output the first clock signal WCK output from the controller 20 or an output signal from a phase locked loop (PLL) 33 as a timing signal using the first clock signal WCK as a first input in response to the first selection signal MRS1 output from the controller 20. The selection circuit 31 may be referred to as a clocking circuit.

The selection circuit 31 may include the PLL 33 and a first selector 35. The first selector 35 may output the first clock signal WCK or the output signal of the PLL 33 according to the first selection signal MRS1. The output from the first selector 35 may be input as a second input of the PLL 33, input to the serializer 43, and input to the phase detector 45.

For example, in response to the first selection signal MRS1 having a first level (e.g., a low level), the first selector 35 may output the first clock signal WCK to serializer 43 and the phase detector 45. Also, the first clock signal WCK may be input to a deserializer (not shown). In response to the first clock signal WCK, the deserializer may deserialize the data received through the data port DP and store the deserialized data in the memory core 41.

When the jitter characteristic of the PLL 33 is inferior to that of the first clock signal WCK, the selection signal generation circuit 21 may output the first selection signal MRS1 having a first level in response to at least one of the data DQ received through the data port DP and the voltage signal PDO output from the phase detector 45. The phase aligner 27 of the controller 20 may align the phase of at least one of the first clock signal WCK and the second clock signal CK in response to the voltage signal PDO output from the phase detector 45. Thus, the phase aligner 27 may perform a function, which may reduce only the absolute value of the data output timing tSAC.

In response to the first selection signal MRS1 having a second level (e.g., a high level), the first selector 35 may output the output signal of the PLL 33 (as a timing signal) to the serializer 43 and the phase detector 45.

In one example, when the feedback path of the PLL 33 increases so that the feedback path has an undesirable effect on operational characteristics of the PLL 33, or when the feedback path of the PLL 33 (e.g., a replica path having the delay time tI) cannot accurately compensate for variation of a real path having the delay time tI, the selection signal generation circuit 21 may output the first selection signal MRS1 having the second level in response to at least one of the data DQ received through the data port DP and the voltage signal PDO output from the phase detector 45.

In this example, the PLL 33 may reduce (e.g., minimize) the feedback path of the PLL 33 to increase (e.g., maximize) the characteristic of the PLL 33, such that jitter of the first clock signal WCK is reduced. According to at least this example embodiment, tSAC(=tO) may be compensated based on the voltage signal PDO output from the phase detector 45.

Still referring to FIG. 2, the memory core 41 may store data, and the serializer 43 may serialize the data output from the memory core 41 in response to the timing signal from the selection circuit 31. The serializer 43 may output the serialized data to the controller 20 via the data port DP. Also, the deserializer (not shown) may deserialize the data received through the data port DP in response to the timing signal, and store the deserialized data in the memory core 41.

The phase detector 45 may generate the voltage signal PDO indicating a phase difference between the second clock signal CK output from the controller 20 and the timing signal output from the selection circuit 31.

Figure 3:
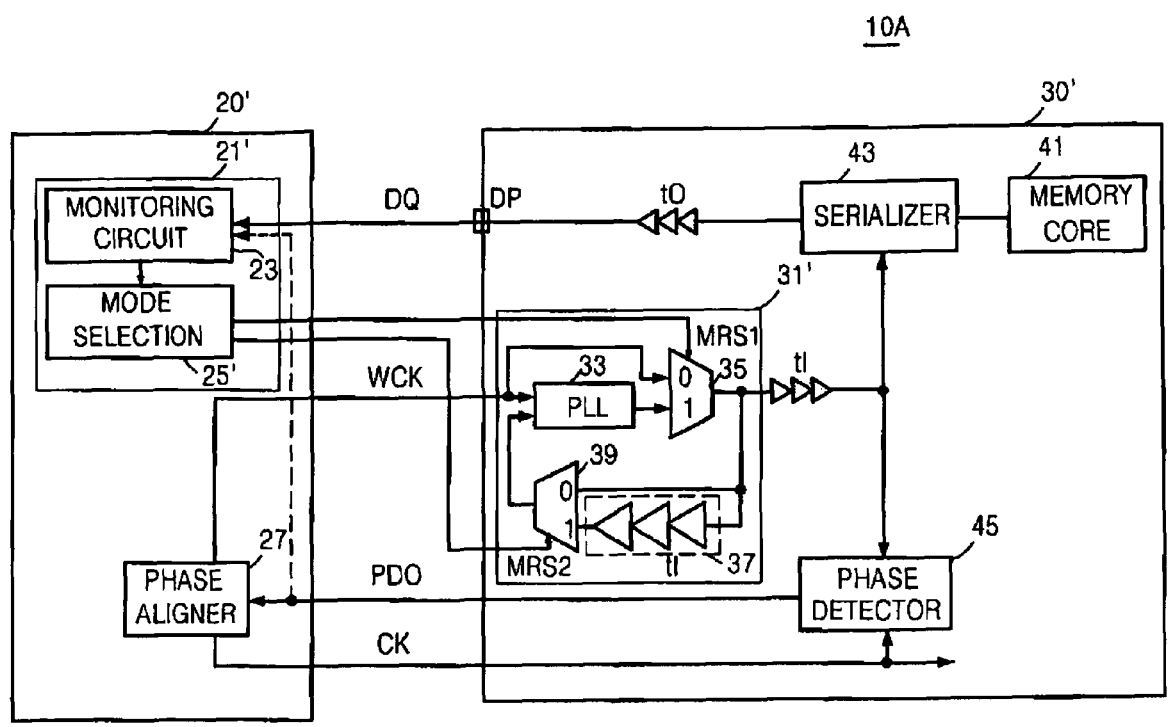
FIG. 3 is a block diagram of a semiconductor system according to another example embodiment.

FIG. 3 is a block diagram of a semiconductor system according to another example embodiment. Referring to FIG. 3, a semiconductor system 10A may include a controller 20' and a semiconductor device 30'. The semiconductor device 30' may be a GDDR5 or the like.

The controller 20' may include a selection signal generation circuit 21' and the phase aligner 27. In response to at least one of the data DQ received through the data port DP of the semiconductor device 30 and the voltage signal PDO output from the phase detector 45, the selection signal generation circuit 21' may output at least two selection signals (e.g., first selection signal MRS1 and second selection signal MRS2).

The selection signal generation circuit 21' may include the monitoring circuit 23 and a mode selection signal generation circuit 25'. In response to at least one analysis signal output from the monitoring circuit 23, the mode selection signal generation circuit 25' may output the first selection signal MRS1 and the second selection signal MRS2. Each of the first and second selection signals MRS1 and MRS2 may be set by a mode register set (MRS) or the like.

In response to the voltage signal PDO output from the phase detector 45, the phase aligner 27 may align the phase of at least one of the first clock signal WCK and the second clock signal CK, and output the first clock signal WCK and the second clock signal CK having aligned or substantially aligned phases. The semiconductor device 30' may include the data port DP, a selection circuit 31', the memory core 41, the serializer 43, and the phase aligner 45. In FIG. 3, "tI" and "tO" indicate delay time due to a signal path, for example, a bus, an electric wire or the like.

The semiconductor device 30' may exchange data with the controller 20' through the data port DP. In response to the first selection signal MRS1 and the second selection signal MRS2 output from the controller 20', the selection circuit 31' may output the first clock signal WCK output from the controller 20' or an output signal of the PLL 33 as a timing signal using the first clock signal WCK as a first input.

The selection circuit 31' may include the PLL 33, first selector 35, a delay circuit 37, and a second selector 39. The selection circuit 31' may be referred to as a clocking circuit. In response to the first selection signal MRS1, the first selector 35 (e.g., a multiplexer) may output the first clock signal WCK or the output signal of the PLL 33. The output from the first selector 35 may be input as a second input of the PLL 33, an input of the serializer 43, and an input of the phase detector 45.

The delay circuit 37 may delay the output signal of the first selector 35 by a given period of time (e.g., tI). In response to the second selection signal MRS2 output from the controller 20', the second selector 39 may output the output signal of the first selector 35 or the output signal of the delay circuit 37 to the PLL 33 (e.g., as a second input of the PLL 33). For example, in response to the second selection signal MRS2 having the first level (e.g., a low level) the second selector 39 may feedback the output signal of the first selector 35 to the PLL 33.

In response to the second selection signal MRS2 having the second level (e.g., a high level), however, the second selector 39 may feedback the output signal of the delay circuit 37 to the PLL 33. For example, when both of the first selection signal MRS1 and the second selection signal MRS2 have the second level, without the step of aligning the first clock signal WCK to the second clock signal CK, the controller 20' may transmit the first clock signal WCK and the second clock signal CK having aligned phases to a first pad (e.g., a pad receiving the first clock signal WCK) and a second pad (e.g., a pad receiving the second clock signal CK) of the semiconductor device 30', respectively.

The feedback path of the PLL 33 (e.g., the delay circuit 37) may compensate for the delay tI of the first clock signal WCK (e.g., the delay time of the real path). Thus, the semiconductor device 30' may have reduced data output time tSAC. For example, when the PLL 33 is in a first state (e.g., the best state), the selection signal generation circuit 21 may output the first selection signal MRS1 and the second selection signal MRS2 having the second level in response to at least one of the data received through the data port DP and the voltage signal PDO output from the phase detector 45.

As described with reference to FIGS. 2 and 3, the semiconductor devices 30 or 30', according to at least some example embodiments, may selectively output a timing signal related to the first clock signal WCK in response to at least one of the first selection signal MRS1 and the second selection signal MRS2 according to at least one characteristic of a semiconductor system 10 or 10A such as a synchronization of the first clock signal WCK and the second clock signal CK, the jitter characteristic of the first clock signal WCK, a characteristic of the PLL 33, and/or a characteristic of a feedback path of the PLL 33 (e.g., a degree of compensation for a change in tI).

Referring to FIGS. 2 and 3, the settings of the first selection signal MRS1 and the second selection signal MRS2 may be summarized as follows.

| CASE | MRS1 | MRS2 |
|---|---|---|
| When the characteristic of PLL is in the first state | Second level (high level) | Second level (high level) |
| When the characteristic of PLL is in the second state and the first clock signal is not clear | Second level | First level (low level) |
| When the characteristic of PLL is in the third state and the first clock signal is clear | First level | Don't care |

As described above, semiconductor devices according to example embodiments may selectively output a timing signal related in time to the first clock signal in response to at least one of the first selection signal and the second selection signal the synchronization of the first clock signal and the second clock signal, the jitter characteristic of the first clock signal, the characteristic of the PLL implemented in the semiconductor device, and/or the characteristic of a feedback path of the PLL, for example, a degree of compensation for a change in delay tI. Thus, semiconductor devices, semiconductor systems and methods of operating the same according to example embodiments may exhibit improved (e.g., maximum) performance.

While example embodiments have been particularly shown and described with reference to the drawings, it will be understood by those skilled in the art that various changes in form and details may be made therein without departing from the spirit and scope of the present invention as defined by the appended claims.

What is claimed is:

1. A semiconductor device comprising:
a selection circuit configured to output a timing signal in response to a first selection signal output from a controller, the timing signal being one of a first clock signal output from the controller and an output signal of a phase locked loop (PLL), the PLL using the first clock signal as a first input; and
a phase detector configured to generate a voltage signal indicative of a phase difference between a second clock signal output from the controller and the timing signal output from the selection circuit.

2. The semiconductor device of claim 1, wherein the semiconductor device further includes,
a data port,
a memory core storing data, and
a serializer configured to serialize data output from the memory core in response to the timing signal output from the selection circuit, the serializer being further configured to output the serialized data to the controller via the data port.

3. The semiconductor device of claim 2, wherein the first selection signal is generated by the controller based on at least one of the voltage signal and the data output from the serializer via the data port.

4. The semiconductor device of claim 1, wherein the controller aligns a phase of at least one of the first clock signal and the second clock signal based on the voltage signal generated by the phase detector.

5. The semiconductor device of claim 2, wherein the first clock signal is related to at least one of input and output of the data and the second clock signal is related to at least one of input and output of addresses or commands.

6. The semiconductor device of claim 1, wherein the selection circuit includes,
a first selector configured to output the first clock signal or the output signal of the PLL as the second input of the PLL and the timing signal, in response to the first selection signal.

7. The semiconductor device of claim 1, wherein the selection circuit includes,
a first selector configured to output the first clock signal or the output signal of the PLL as the timing signal in response to the first selection signal,
a delay circuit configured to delay the timing signal from the first selector, and
a second selector configured to output the timing signal or the delayed timing signal from the delay circuit as a second input of the PLL in response to a second selection signal output from the controller.

8. The semiconductor device of claim 7, wherein the semiconductor device further includes,
a data port,
a memory core storing data, and
a serializer configured to serialize data output from the memory core and output serialized data to the controller via the data port in response to the timing signal from the selection circuit, wherein
at least one of the first selection signal and the second selection signal are generated by the controller based on at least one of the data output to the controller via the data port and the voltage signal.

9. The semiconductor device of claim 7, wherein at least one of the first selection signal and the second selection signal are generated by the controller based on at least one of the voltage signal and the data output to a controller via the data port.

10. The semiconductor device of claim 7, wherein the controller aligns a phase of at least one of the first clock signal and the second clock signal based on the voltage signal generated by the phase detector.

11. The semiconductor device of claim 7, wherein the first clock signal is related to at least one of input and output of a data and the second clock signal is related to at least one of input and output of addresses or commands.

12. A semiconductor system comprising:
the semiconductor device of claim 1; and
a controller configured to output the first selection signal, the first clock signal, and the second clock signal to the semiconductor device.

13. The semiconductor system of claim 12, wherein the controller includes,
a phase aligner configured to align a phase of at least one of the first clock signal and the second clock signal in response to a received voltage signal.

14. The semiconductor system of claim 12, wherein the semiconductor device further includes, a data port, a memory core storing data, and a serializer configured to serialize data output from the memory core and output the serialized data to the controller via the data port in response to the timing signal from the selection circuit, wherein the controller further includes a selection signal generation circuit configured to output the first selection signal based on at least one of the received voltage signal and the serialized data received via the data port.

15. The semiconductor system of claim 12, wherein the selection circuit includes, a first selector configured to output the first clock signal or the output signal of the PLL as a second input of the PLL and the timing signal in response to the first selection signal.

16. The semiconductor system of claim 12, wherein the selection circuit includes, a first selector configured to output the first clock signal or the output signal of the PLL as the timing signal in response to the first selection signal, a delay circuit configured to delay the timing signal from the first selector, and a second selector configured to output the timing signal or the delayed timing signal from the delay circuit as a second input of the PLL in response to a second selection signal output from the controller.

17. The semiconductor system of claim 16, wherein the semiconductor device further includes, a data port, a memory core storing data, and a serializer configured to serialize data output from the memory core and output serialized data to the controller via the data port in response to the timing signal from the selection circuit, wherein the controller further includes, a selection signal generation circuit configured to generate at least one of the first selection signal and the second selection signal based on at least one of the received voltage signal and the serialized data received via the data port.

18. The semiconductor system of claim 16, wherein at least one of the first selection signal and the second selection signal is generated by the controller based on at least one of the voltage signal and the data output to the controller via the data port.

19. The semiconductor system of claim 16, wherein the controller aligns a phase of at least one of the first clock signal and the second clock signal based on the voltage signal generated by the phase detector.

20. The semiconductor system of claim 16, wherein the first clock signal is related to at least one of input and output of the data and the second clock signal is related to at least one of input and output of addresses or commands.

21. A method of aligning a first clock signal to a second clock signal, the method comprising:

outputting a timing signal in response to a first selection signal output from a controller, the timing signal being one of a first clock signal output from the controller and an output signal of a phase locked loop (PLL), the PLL using the first clock signal as a first input; and outputting data output from a memory core to the controller via a data port in response to the timing signal; wherein the first clock signal is generated by the controller based on the output data.

22. The method of claim 21, further including, generating a voltage signal corresponding to a phase difference between a second clock signal output from the controller and the timing signal, and outputting the generated voltage signal to the controller, wherein a phase of at least one of the first clock signal and the second clock signal is aligned according to the voltage signal.

23. The method of claim 22, wherein the first clock signal is generated by the controller based on at least one of the data and the voltage signal.

24. The method of claim 21, further including, delaying the timing signal, and outputting the timing signal or the delayed timing signal as a second input of the PLL in response to a second selection signal provided by the controller, wherein the second selection signal is generated by the controller based on the data.

25. The method of claim 24, further including, generating a voltage signal corresponding to a phase difference between the second clock signal and the timing signal, and outputting a generated voltage signal to the controller, wherein a phase of at least one of the first clock signal and the second clock signal is aligned according to the voltage signal.

* * * * *